United States Patent
Beer et al.

(12) 
(10) Patent No.: US 6,225,601 B1
(45) Date of Patent: May 1, 2001

(54) HEATING A SUBSTRATE SUPPORT IN A SUBSTRATE HANDLING CHAMBER

(75) Inventors: Emanuel Beer; Duoyan Shen, both of San Jose; Eitan Zohar, Cupertino; Marc M. Kollrack, San Francisco, all of CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/115,112

(22) Filed: Jul. 13, 1998

(51) Int. Cl.[7] .................................................. F27B 5/14
(52) U.S. Cl. .................. 219/390; 392/416; 118/724; 118/725
(58) Field of Search ................................ 219/390, 405, 219/411; 392/416, 418; 118/724, 725, 728, 50.1

(56) References Cited

U.S. PATENT DOCUMENTS

| | | |
|---|---|---|
| 4,061,870 | 12/1977 | Mizushina . |
| 4,886,954 | 12/1989 | Yu et al. . |
| 5,352,294 | 10/1994 | Whiwte et al. .................. 118/725 |
| 5,536,918 * | 7/1996 | Ohkase et al. .................. 219/390 |
| 5,589,233 | 12/1996 | Law et al. ........................ 427/579 |
| 5,633,073 | 5/1997 | Cheung et al. .................. 428/209 |
| 5,645,646 | 7/1997 | Beinglass et al. ............... 118/730 |
| 5,653,808 | 8/1997 | MacLeish et al. . |
| 5,790,750 * | 8/1998 | Anderson ......................... 392/416 |
| 5,928,732 | 7/1999 | Law et al. . |
| 5,930,456 * | 7/1999 | Vosen .............................. 392/416 |
| 5,958,140 * | 9/1999 | Arami et al. .................... 118/725 |
| 5,970,214 * | 10/1999 | Get .................................. 392/416 |

FOREIGN PATENT DOCUMENTS

| | | |
|---|---|---|
| 0 661 732 | 7/1995 | (EP) . |
| 0 798 773 | 10/1997 | (EP) . |

* cited by examiner

Primary Examiner—Teresa Walberg
Assistant Examiner—Shawntina Fuqua
(74) Attorney, Agent, or Firm—Fish & Richardson; Robert J. Stern (57) ABSTRACT

A technique for heating a substrate support, such as a susceptor, includes establishing respective final temperature setpoints for first and second heating elements in the susceptor. The temperatures of the heating elements are raised to their respective final temperature setpoints based on a predetermined heating rate. The temperatures of the first and second heating elements are controlled so that the difference between the temperatures of the first and second heating elements does not exceed the predetermined value while the temperatures of the heating elements are raised to their respective final temperature setpoints. Controlling the temperatures includes setting interim setpoints for the first and second heating elements, where the interim setpoint for the heating element having the greater heating capacity depends on the current value of the interim setpoint of the other heating element and the predetermined value. The temperatures of the first and second heating elements are raised toward their respective interim temperature setpoints for a predetermined delay period. At the end of the delay period, new interim setpoints can be established and the process repeated until the temperature of at least one of the first and second heating elements is close to its respective final setpoint. A relatively high duty cycle can be achieved which also reduces the likelihood of deformation of the substrate support.

24 Claims, 4 Drawing Sheets

HEATING A SUBSTRATE SUPPORT IN A SUBSTRATE HANDLING CHAMBER

BACKGROUND

The present invention relates generally to substrate handling and processing chambers, and, in particular, to heating a substrate support in such chambers.

Glass substrates are being used for applications such as active matrix television and computer displays, among others. Each glass substrate can form multiple display monitors each of which contains more than a million thin film transistors.

The glass substrates can have dimensions, for example, of 550 mm by 650 mm. The trend, however, is toward even larger substrate sizes, such as 650 mm by 830 mm and larger, to allow more displays to be formed on the substrate or to allow larger displays to be produced. The larger sizes place even greater demands on the capabilities of the processing systems.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

Plasma-enhanced chemical vapor deposition (PECVD) is another process widely used in the processing of glass substrates for depositing layers of electronic materials on the substrates. In a PECVD process, a substrate is placed in a vacuum deposition chamber equipped with a pair of parallel plate electrodes. The substrate generally is mounted on a susceptor which also serves as the lower electrode. A flow of a reactant gas is provided in the deposition chamber through a gas inlet manifold which also serves as the upper electrode. A radio frequency (RF) voltage is applied between the two electrodes which generates an RF power sufficient to cause a plasma to be formed in the reactant gas. The plasma causes the reactant gas to decompose and deposit a layer of the desired material on the surface of the substrate body. Additional layers of other electronic materials can be deposited on the first layer by flowing another reactant gas into the chamber. Each reactant gas is subjected to a plasma which results in the deposition of a layer of the desired material.

Some problems associated with the processing of large glass substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the glass substrate combined with its size, therefore, makes it more difficult to obtain uniform characteristics for the electronic components formed on different portions of the surface of a processed substrate. Moreover, heating or cooling the substrates quickly and uniformly is more difficult as a consequence of its poor thermal conductivity, thereby posing special challenges to achieving a high throughput.

To help obtain a more uniform temperature across large substrates, susceptors having multiple heating elements have been used. For example, some susceptors include inner and outer heating elements. The use of multiple heating elements, however, occasionally results in the susceptor becoming deformed as it is heated. One cause of the deformation is a temperature differential that can occur between the inner and outer heating elements. If the temperature differential, or gap, becomes too large, the thermal stresses in the susceptor can result in deformation of the susceptor and, in some instances, even breakage.

SUMMARY

In general, in one aspect, a method of heating a substrate support includes establishing respective final temperature setpoints for first and second heating elements of the substrate support. The difference in temperatures of the first and second heating elements is caused to be less than a predetermined value $\Delta T$, if the difference initially exceeds the predetermined value. The temperatures of the heating elements then are raised to their respective final temperature setpoints $T_{F1}$, $T_{F2}$ based on a predetermined heating rate R. Furthermore, the temperatures of the first and second heating elements are controlled so that the difference between the temperatures of the first and second heating elements does not exceed the predetermined value $\Delta T$ while the temperatures of the heating elements are raised to their respective final temperature setpoints.

In general, the final temperature setpoints of the heating elements need not be the same. Controlling the temperatures of the heating elements can include setting a first interim temperature setpoint for the first heating element and setting a second interim temperature setpoint for the second heating element. The second interim setpoint depends on the current value of the first interim setpoint and the predetermined value $\Delta T$. The temperatures of the first and second heating elements then are raised toward their respective interim temperature setpoints for a predetermined delay period. At the end of the delay period, new interim setpoints can be established and the process repeated until the temperature of at least one of the first and second heating elements is within a predetermined amount of its respective final setpoint.

In some implementations, the second interim value used for the second heating element is set equal to the current value of the first interim setpoint plus the predetermined value $\Delta T$. The value of the first interim setpoint can depend on the current temperature of the first heating element and the predetermined heating rate R. For example, the first interim setpoint can be set equal to the sum of the current temperature of the first heating element and the value of the predetermined heating rate R.

In another aspect, a substrate handling apparatus includes a substrate processing chamber and a substrate support disposed in the chamber. The substrate support includes first and second heating elements for heating the substrate support and a controller for controlling the temperature of the heating elements according to the foregoing techniques.

In some implementations, the first and second heating elements are inner and outer heating elements embedded within the substrate, respectively. In addition, the heating elements can have different heating capacities. For example, according to one implementation, the second heating element has a heating capacity greater than the heating capacity of the first heating element.

The techniques described herein are not limited to a substrate support having only two heating elements. Rather, the techniques are applicable to the heating of substrate supports with more than two heating elements or more than two heating zones.

In addition, in various implementations, one or more of the final temperature setpoints for the heating elements, the predetermined heating rate R, and the predetermined value ΔT can be selected by the user, thereby providing a flexible technique which easily can be modified for different systems or configurations.

Various implementations include one or more of the following advantages. The rate at which the interim temperature setpoints for each of the heating elements is increased is designed to be as high as the predetermined heating rate R, within the limitations, for example, of the capabilities of the heating elements. Each time the heating elements approach the current interim setpoints, the interim setpoints can be increased, thereby maintaining a relatively high duty cycle. Maintaining a limited temperature gap between the heating elements and increasing the interim temperature setpoints toward the final setpoints causes heat transfer from the heating element with the greater heating capacity to the heating element with the lower heating capacity. The heating element with the greater heating capacity, therefore, works at a duty cycle that is higher than the duty cycle it would have used solely for its own heating. In other words, the power of the heating element with the greater capacity is used to increase the temperature of regions of the substrate support near the heating element with the lower heating capacity.

Moreover, by limiting the difference between the interim temperature setpoints to a predetermined value, the likelihood that the temperature difference between the heating elements will exceed the predetermined value ΔT is reduced. That, in turn, can substantially reduce the likelihood of deformation and breakage of the substrate support if the predetermined value ΔT is selected carefully.

Other features and advantages will be apparent from the following detailed description, accompanying drawings and claims.

DETAILED DESCRIPTION

Figure 1:
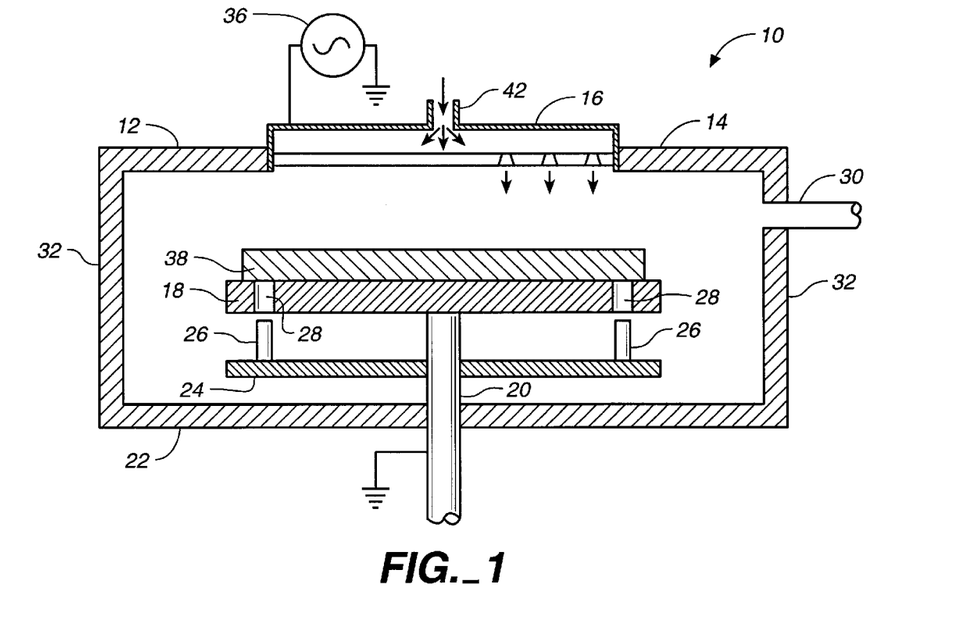
FIG. 1 illustrates an exemplary thermal deposition chamber.

Referring to FIG. 1, a plasma-enhanced chemical vapor deposition apparatus 10 includes a deposition chamber 12 having an opening through a top wall 14 and a first electrode or a gas inlet manifold 16 within the opening. Alternatively, the top wall 14 can be solid with the electrode 16 adjacent to the inner surface of the top wall. A substrate support, such as a susceptor 18 in the form of a plate, extends within the chamber 12 parallel to the first electrode 16. The susceptor 18 is formed of aluminum and can be coated with a layer of aluminum oxide. Embedded within the susceptor 18 are a first, or inner, heating element 46 and a second, or outer, heating element 48 (FIG. 2), which can be formed, for example, as heating coils. In some implementations, the heating elements 46, 48 need not be embedded within the susceptor 18 as long as they are in thermal contact with the susceptor or other substrate support.

Figure 2:
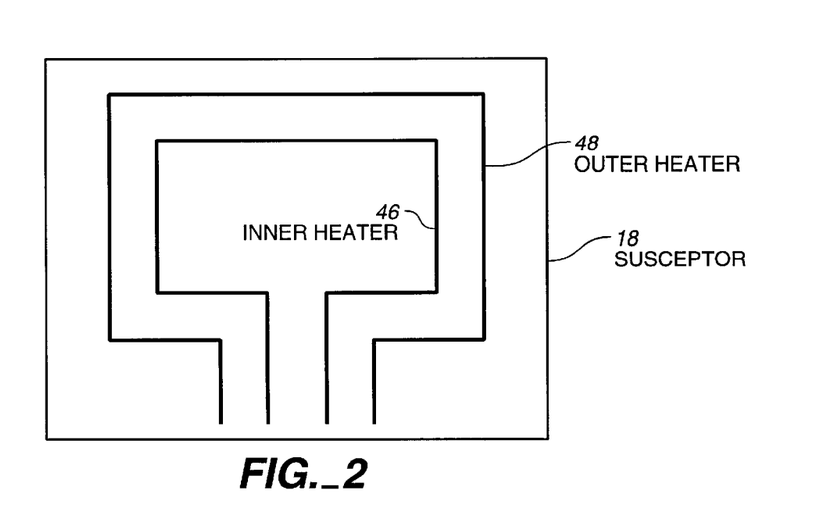
FIG. 2 illustrates an exemplary substrate support for the chamber of FIG. 1.

Although the heating capacity of the heating elements 46, 48 can be the same, in one implementation, the outer heating element 48 has a relatively high heating capacity, whereas the inner heating element 46 has a relatively low heating capacity. For example, in the illustrated implementation, approximately 40 kilo Watts (kW) are supplied to the outer heating element 48, and approximately 20 kW are supplied to the inner heating element 46. Providing more power to the outer heating element 48 can help compensate for thermal losses which typically are greater near the outer perimeter of the susceptor 18. In other implementations, however, the inner heating element 46 can be more highly powered than the outer heating element 48, and the role of the inner and outer heating elements 46, 48 can be reversed. To provide the heating elements 46, 48 with different heating capacities, different power sources can be used. Alternatively, a common source can be used, and the heating capacity of the heating elements 46, 48 can be made to differ by forming the heating elements from different materials. The selection of which heating element should be provided with a larger heating capacity depends, among other things, on the size of respective zones on the susceptor 18 which the heating elements 46, 48 are intended to heat. In any event, providing the heating elements 46, 48 with different heating capacities can be particularly important in the processing of glass substrates having dimensions of 650 mm by 830 mm and higher due to the large size of such substrates as well as the thermal properties of the glass.

The susceptor 18 is connected to ground so that it serves as a second electrode and is mounted on the end of a shaft 20 (FIG. 1) which extends vertically through a bottom wall 22 of the chamber 12. The shaft 20 is movable vertically to permit the vertical movement of the susceptor 18 toward and away from the first electrode 16.

A lift-off plate 24 extends horizontally between the susceptor 18 and the bottom wall 22 of the chamber 12 substantially parallel to the susceptor and is movable vertically. Lift-off pins 26 project vertically upward from the lift-off plate 24. The lift-off pins 26 are positioned to be able to extend through lift holes 28 in the susceptor 18, and have a length slightly longer than the thickness of the susceptor. While only two lift-off pins 26 are shown in FIG. 1, there may be additional lift-off pins spaced around the lift-off plate 24.

Figure 3:
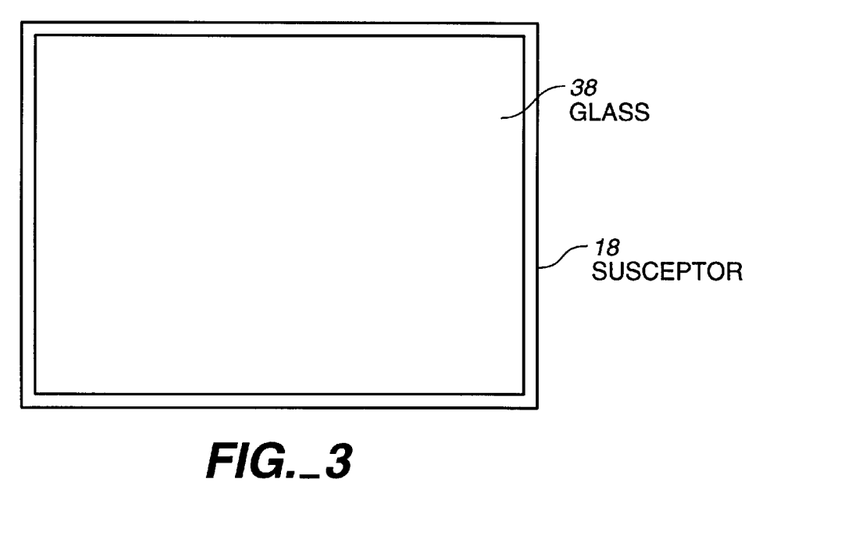
FIG. 3 illustrates a glass substrate placed on the substrate support of FIG. 2.

A gas outlet 30 extends through a side wall 32 of the chamber 12 and is connected to a system (not shown) for evacuating the chamber. A gas inlet pipe 42 extends into the gas inlet manifold 16 and is connected through a gas switching network to sources of various gases (not shown). The first electrode 16 is connected to an RF power source 36. A transfer mechanism (not shown) can be provided to carry a substrate 38 through a load-lock door into the deposition chamber 12 where the substrate can be transferred onto the susceptor 18 (FIGS. 1 and 3). The transfer mechanism also is used to remove the processed substrate from the chamber.

Prior to transferring a substrate 38 onto the susceptor 18, the susceptor is pre-heated to a desired temperature, for example, approximately 400° C. As described in greater detail below, a temperature controller 50 (FIG. 4), such as a computer or other processor, controls the temperature of the heating elements 46, 48. The controller 50 is programmed with software and configured to perform the functions described below. Thermocouples 52 can be used to measure the temperature of the heating elements 46, 48 and are coupled to the controller 50 to provide such information to the controller.

Figure 4:
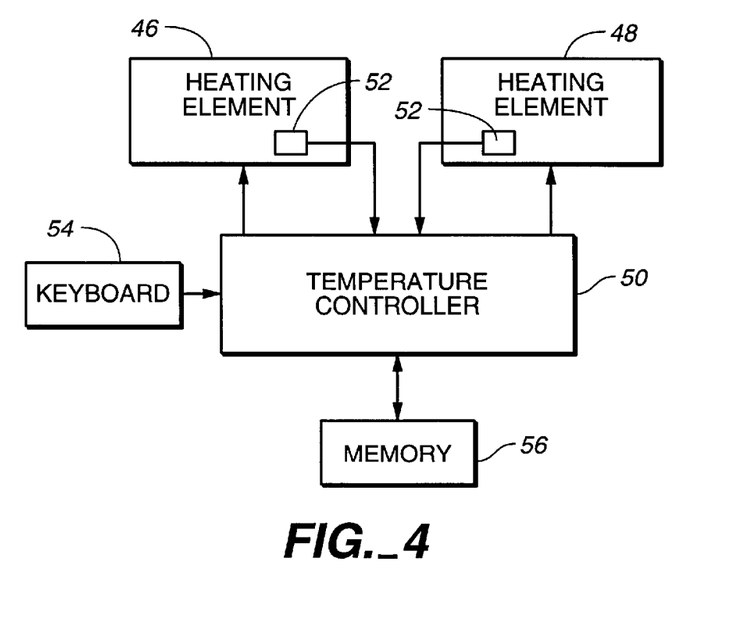
FIG. 4 shows a control system for controlling the temperature of the substrate support of FIG. 2 according to the invention.

The software allows a user to enter values for several variables, including final setpoints $T_{F1}$, $T_{F2}$, for the temperature of the inner and outer heating elements 46, 48. The values of the user-defined variables can be entered, for example, using a keyboard 54 or other input device coupled to the controller 50. The final setpoints $T_{F1}$, $T_{F2}$ for the heating elements 46, 48 may differ from one another. Providing different setpoints allows heat flow from one area of the susceptor 18 to another area to be controlled more precisely, as described in greater detail below. Such heat flow can be desirable to compensate for the large size and relatively poor thermal properties of the glass substrates.

The software also allows the user to select the value of a heating rate R that defines an approximate rate (° C./minute) at which the temperatures of the heating elements 46, 48 increase. In one exemplary embodiment, R is set to 10° C. per minute. An interlock in the software prevents a value of R from being used if it would overheat or otherwise damage the system. If a value of R is selected by the user which exceeds a maximum rate, then the system can be shut off or a maximum default value for the rate R can be used.

In some implementations, the user also enters a maximum allowable value for the difference $\Delta T$ between the measured temperature $T_1$ of the inner heating element 46 and the measured temperature $T_2$ of the outer heating element 48. In other implementations, however, the value of $\Delta T$ is preset in the software and is not defined by the user. In any event, the value of $\Delta T$ is determined prior to heating the susceptor 18. In one exemplary embodiment, the value of $\Delta T$ is set to 20° C., although other values also can be used depending on the particular construction of the susceptor 18 and the process to be performed. The user-defined values are stored in memory 56.

Figure 5A:
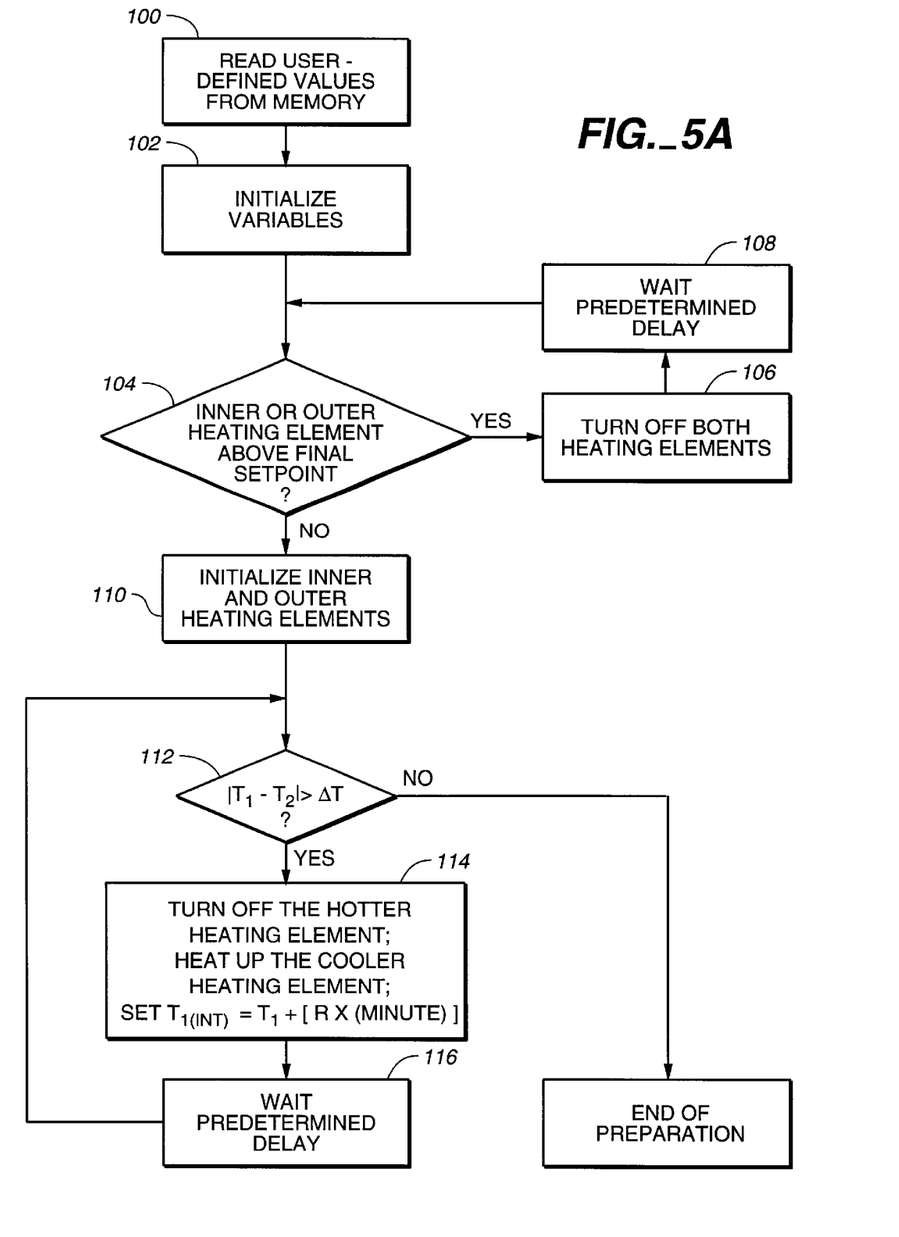
FIGS. 5A and 5B are a flow chart illustrating a method of heating the substrate support of FIG. 2 according to the invention.
Figure 5B:
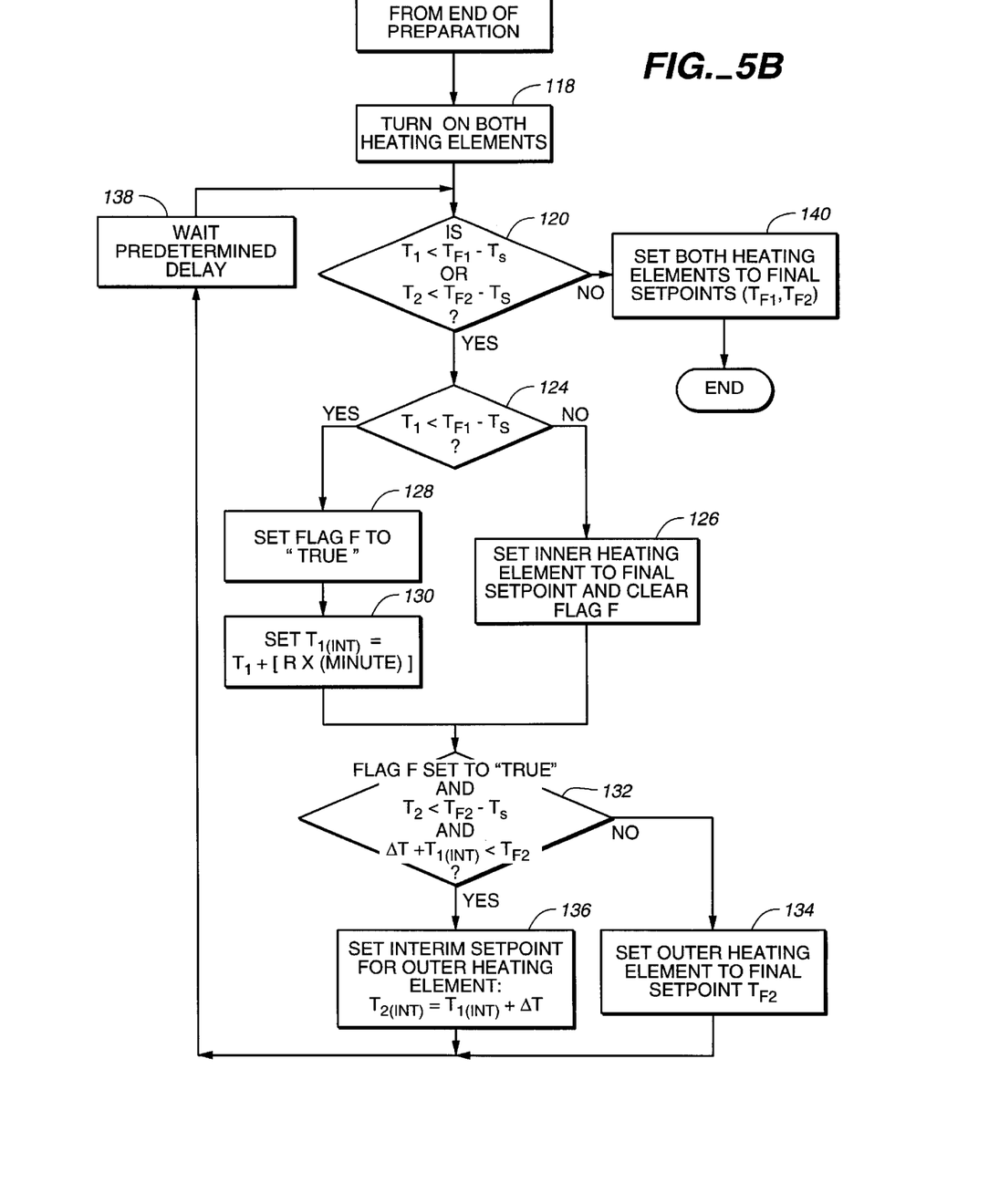

Referring to FIGS. 5A and 5B, once the user has entered the value of the user-defined variables, including the values for the final setpoints $T_{F1}$, $T_{F2}$ and the heating rate R, those values are read from memory 56 (step 100). If the value for $\Delta T$ is set by the user, then it also is retrieved from memory. Various Boolean-type and other variables are initialized (step 102). For example, a Boolean flag F initially is set to "false." The state of the flag F is changed to "true" if the temperature of the inner heating element 46 is lower than a predetermined amount $T_s$ below the final setpoint $T_{F1}$, in other words, if $T_1 < T_{F1} - T_s$. In one embodiment, for example, the predetermined amount $T_s$ is 5° C. Thus, if the final setpoint $T_{F1}$ were set to 400° C., the flag F changes to "true" if the temperature of the inner heating element 46 is less than 395° C. In addition, if the value of $\Delta T$ is not set by the user, then the value of $\Delta T$ also would be initialized in step 102.

A determination then is made as to whether either the temperature $T_1$ of the inner heating element 46 or the temperature $T_2$ of the outer heating element 48 is above its respective final setpoint $T_{F1}$, $T_{F2}$ (step 104). When the system is first turned on, both heating elements 46, 48 normally will be below their final setpoints. However, if the determination in step 104 is affirmative, then both heating elements 46, 48 are shut off (step 106). The controller 50 waits a predetermined time (step 108), for example, 30 seconds, and then returns to step 104 to check the temperatures $T_1$, $T_2$. The controller 50 continues to cycle through the loop formed by steps 104–108 until both heating elements 46, 48 are below their respective final setpoints $T_{F1}$, $T_{F2}$. The controller 50 then initializes the heating elements 46, 48 by making power available to them (step 110).

Next, the controller 50 executes a pre-heating preparation stage to ensure that the difference between the current temperatures $T_1$, $T_2$ of the heating elements 46, 48 does not exceed the maximum allowable difference $\Delta T$. Therefore, a determination is made as to whether the value of $T_1$ minus $T_2$ exceeds the value of $\Delta T$ (step 112). If the value does not exceed $\Delta T$, in other words if the temperature difference between the inner and outer heating elements 46, 48 is not too large, then the controller 50 proceeds to execute a preliminary susceptor heating process that raises the temperature of the susceptor 18 to the desired final setpoints, as described below.

On the other hand, if in step 112 it is determined that the difference between $T_1$ and $T_2$ exceeds $\Delta T$, then the hotter heating element, for example, the outer heating element 48, is turned off, and the remaining heating element 46 is heated (step 114). During step 114, an interim setpoint $T_{1(INT)}$ is established for the temperature of the inner heating element 46, where $$T_{1(INT)} = T_1 + [(R) \times (\text{minute})].$$

In addition, during step 114 the inner heating element 46 is allowed to heat up at a maximum greater than the value of R. For example, in one implementation, the inner heating element 46 is permitted to heat up at a maximum rate equal to twice the value of R. Of course, the actual rate at which the inner heating element heats up during this step may be limited by the physical capabilities of the heating element. The controller 50 then waits for a pre-determined delay period to elapse (step 116). The pre-determined delay can be, for example, thirty seconds. During the delay period, the temperature of the inner heating element 46 is not permitted to exceed the current value of $T_{1(INT)}$. At the end of the delay period, the controller 50 returns to step 112 to determine whether the value of $T_1$ minus $T_2$ exceeds the value of $\Delta T$. The controller continues to execute the loop formed by steps 112–116 until the difference between the temperature $T_1$ of the inner heating element and the temperature $T_2$ of the outer heating element does not exceed $\Delta T$. The controller 50 then executes a preliminary susceptor heating process that raises the temperature of the susceptor 18 to the desired final setpoints.

Although the algorithm executed by the controller 50 helps ensure that the difference between the temperatures of the heating elements does not exceed $\Delta T$, maintaining a non-zero gap between the temperatures of the heating elements that is less than $\Delta T$ can result in a heat flow between areas of the susceptor 18 that allows the susceptor to heat up more quickly and more efficiently. Thus, as described more fully below, the higher heating capacity of the outer heating element 48, for example, can be used to augment heating by the inner heating element 46.

In general, the preliminary susceptor heating process, as described below, is designed to allow the susceptor 18 to be heated to its final temperature as quickly as possible based on the rate R selected by the user while maintaining the difference between the temperatures of the heating elements 46, 48 at a value less than $\Delta T$. Both heating elements are turned on (step 118) and a determination is made as to whether either the temperature $T$, of the inner heating element 46 is less than $T_{F1}$ minus $T_s$ or whether the temperature $T_2$ of the outer heating element 48 is less than $T_{F2}$ minus $T_s$ (step 120). If both heating elements 46, 48 are close to their respective final setpoints, in other words, if the determination in step 120 is negative, then interim setpoints $T_{1(INT)}$ and $T_{2(INT)}$ for both heating elements are set to the respective final setpoints $T_{F1}$, $T_{F2}$ to allow the susceptor 18 to heat up to its final temperature (step 140). The preliminary susceptor heating process then would be completed, and the controller 50 would control the heating elements 46, 48 to maintain the susceptor temperature at the desired level.

On the other hand, if the determination in step 120 is affirmative, in other words, if the temperature of at least one of the heating elements 46, 48 is not close to its respective final setpoint, then a determination is made as to whether the temperature $T_1$ of the inner heating element 46 is less than $T_{F1}$ minus $T_s$ (step 124). If the determination is answered in the negative, in other words, if the temperature of the inner heating element 46 is close to its final setpoint $T_{F1}$, then the flag F is cleared to "false", and the interim setpoint $T_{1(INT)}$ for the inner heating element 46 is set to the final setpoint $T_{F1}$ (step 126).

If the determination in step 124 is answered in the affirmative, in other words, if the temperature $T_1$ of the inner heating element 46 is not close to its final setpoint $T_{F1}$, then the flag F is set to "true" (step 128). In addition, the interim setpoint $T_{1(INT)}$ for the temperature of the inner heating element 46 is set equal to the current temperature $T_1$ of the inner heating element plus the value of the heating rate R (step 130), in other words, $T_{1(INT)} = T_1 + [(R) \times (\text{minute})]$.

Regardless of whether the algorithm follows step 126 or steps 128–130, the controller 50 proceeds to make a determination as to whether three conditions are satisfied (step 132). First, the flag F must be set to "true," in other words, the temperature $T_1$ of the inner heating element 46 must be less than its final setpoint $T_{F1}$ by at least $T_s$. Second, the temperature $T_2$ of the outer heating element 48 also must be well below its final setpoint, in other words, $T_2 < T_{F2} - T_s$. Third, the sum of $\Delta T$ and the current interim setpoint $T_{1(INT)}$ established for the inner heating element 46 must be less than the final setpoint $T_{F2}$ for the outer heating element, in other words, $\Delta T + T_{1(INT)} < T_{F2}$. This last condition helps prevent the outer heating element 48 from overshooting the final setpoint $T_{F2}$ if the algorithm proceeds to step 136.

If one or more of those three conditions is not satisfied, then an interim setpoint $T_{2(INT)}$ for the outer heating element 48 is set equal to the final setpoint $T_{F2}$ (step 134). The controller 50 then waits for a predetermined delay period to elapse (step 138). The predetermined delay can be, for example, sixty seconds, although other delays may be appropriate in some situations. At the end of the delay period, the controller 50 returns to step 120.

On the other hand, if all three conditions in step 132 are satisfied, the interim setpoint T2(INT) for the outer heating element 48 is set, as indicated by step 136, according to:

$$T_{2(INT)} = T_{1(INT)} + \Delta T.$$

The controller 50 then waits for a predetermined delay period to elapse (step 138). The predetermined delay can be, for example, sixty seconds, although other delays may be appropriate in some situations. At the end of the delay period, the controller 50 returns to step 120.

In general, during the delay period of step 138, the temperature $T_1$ of the inner heating element 46 should not exceed the current value of $T_{1(INT)}$, and the temperature $T_2$ of the outer heating element 48 is not permitted to exceed the current value of $T_{2(INT)}$. By making the values of $T_{1(INT)}$ and $T_{2(INT)}$ dependent on one another as expressed by the equation in step 136, the likelihood that the difference between the temperatures $T_1$, $T_2$ of the heating elements 46, 48 will become too large is greatly reduced. Thus, the susceptor 18 can be heated to its final temperature based on the rate R selected by the user and, at the same time, in a manner that substantially reduces the possibility of susceptor breakage.

The controller 50 continues to execute the loop formed by steps 120–138 until the temperatures $T_1$, $T_2$ of both heating elements 46, 48 are close to their respective final setpoints $T_{F1}$, $T_{F2}$ so that the interim setpoints $T_{1(INT)}$, $T_{2(INT)}$ can be set equal, respectively, to $T_{F1}$, $T_{F2}$ (step 140). Once the heating elements 46, 48 reach their respective final setpoints $T_{F1}$, $T_{F2}$, the preliminary susceptor heating process is completed, and the controller 50 controls the heating elements 46, 48 to maintain the susceptor temperature at its desired final temperature. A substrate then can be transferred onto the susceptor 18 for heating and processing.

The rate at which the interim temperature setpoints for each of the heating elements 46, 48 are increased is designed to be as high as the rate R selected by the user, although the actual heating rate may be limited by the heating capacities of the heating elements or other factors. Each time the heating elements 46, 48 approach the current interim setpoints, the interim setpoints are increased, thereby maintaining a relatively high duty cycle. Maintaining a limited temperature gap between the heating elements 46, 48 and constantly increasing the interim temperature setpoints causes heat transfer from the heater with the greater heating capacity (e.g., the outer heating element 48) to the heater with the lower heating capacity (e.g., the inner heating element 46). The heating element with the greater heating capacity, therefore, works at a duty cycle that is higher than the duty cycle it would have used solely for its own heating. In other words, the power of the heating element with the greater capacity is used to increase the temperature of regions of the susceptor near the heating element with less capacity.

Furthermore, while the implementation discussed above has been described for a substrate support having two heating elements, the foregoing technique can be used to heat a substrate support having more than two heating elements as well. In such a configuration, all the heating elements, except the coolest heating element, can be treated like the outer heating element described above such that the difference in temperature between the coolest heating element and each one of the other heating elements does not exceed the predetermined value $\Delta T$.

In addition, the foregoing technique can be used in connection with substrate supports other than susceptors, such as heating platens, and in substrate handling systems using techniques other than PECVD. For example, the technique can be incorporated a wide variety of substrate handling systems in which a substrate is heated. The technique also can be used to control the heating of a substrate support in chambers other than process chambers, such as pre-heating or load lock chambers. Additionally, the technique described above can be used for heating substrate supports for substrates made of materials other than glass.

Other implementations are within the scope of the following claims.

What is claimed is:

1. Heating apparatus for rapidly increasing the respective temperatures of first and second regions of a susceptor from a first and second initial temperature, respectively, to a first and second final temperature, respectively, comprising:

a processing chamber;

a susceptor disposed in the chamber;

first and second heating elements respectively coupled to supply heat to first and second regions of the susceptor; and a controller for controlling the heat supplied to the susceptor by the first and second heating elements by establishing first and second interim setpoint temperatures so as to permit the first and second heating elements to heat the first and second regions of the susceptor to respective temperatures no greater than the first and second interim setpoint temperatures, respectively;

wherein the controller increases the temperature of the first region by progressively increasing the first interim setpoint temperature at successive times until the controller increases the first interim setpoint temperature to the first final temperature; and wherein, at each of said successive times, the controller establishes the second interim setpoint temperature as equal to the current value of the first interim setpoint temperature plus a predetermined temperature offset value.

2. Heating apparatus for rapidly increasing the respective temperatures of first and second regions of a susceptor from a first and second initial temperature, respectively, to a first and second final temperature, respectively, comprising:

a processing chamber;

a susceptor disposed in the chamber;

first and second heating elements respectively coupled to supply heat to first and second regions of the susceptor; and a controller for controlling the heat supplied to the susceptor by the first and second heating elements by establishing first and second interim setpoint temperatures so as to permit the first and second heating elements to heat the first and second regions of the susceptor to respective temperatures no greater than the first and second interim setpoint temperatures, respectively;

wherein the controller increases the temperature of the first region by progressively increasing the first interim setpoint temperature at successive times until the controller increases the first interim setpoint temperature to the first final temperature; and wherein, at each of said successive times, the controller establishes the first interim setpoint temperature as equal to the current temperature of the first heating element plus the value of a predetermined heating rate.

3. The apparatus of claim 2 wherein the controller establishes the second interim setpoint temperature as equal to the current value of the first interim setpoint temperature plus a predetermined temperature offset value.

4. Heating apparatus for rapidly increasing the respective temperatures of first and second regions of a susceptor, comprising:

a processing chamber;

a susceptor disposed in the chamber;

first and second heating elements respectively coupled to supply heat to first and second regions of the susceptor; and a controller connected to control the first and second heating elements;

wherein, during an initial time period, if the difference between the temperatures of the first and second heating elements is greater than a predetermined temperature offset value, the controller turns off the second heating element and directs the first heating element to heat up while the second heating element is turned off; and wherein, after said initial time period, the controller directs both the first and second heating elements to heat up.

5. The apparatus of claim 4 wherein, during said initial time period, the controller allows the first heating element to heat up for a predetermined period of time and then checks whether the difference between the temperatures of the heating elements exceeds the predetermined temperature offset value upon completion of the predetermined period of time.

6. The apparatus of claim 5, wherein the controller terminates the initial timer period when the difference between the temperatures of the heating elements no longer exceeds the predetermined temperature offset value.

7. The apparatus of claim 5, wherein:

during said initial time period, the controller directs the first heating element to heat up at a maximum rate that exceeds a predetermined heating rate while the second heating element is turned off; and after said initial time period, the controller directs the first and second heating elements to heat up at respective rates that do not exceed said predetermined heating rate.

8. A method of rapidly increasing the respective temperatures of first and second regions of a susceptor from a first and second initial temperature, respectively, to a first and second final temperature, comprising the steps of:

coupling first and second heating elements, respectively, to supply heat to the first and second regions of the susceptor; and establishing first and second interim setpoint temperatures so as to permit the first and second heating elements to heat the first and second regions of the susceptor to respective temperatures no greater than the first and second interim setpoint temperatures, respectively;

wherein the establishing step includes the steps of
progressively increasing the first interim setpoint temperature at successive times until the controller increases the first interim setpoint temperature to the first final temperature, and at each of said successive times, establishing the second interim setpoint temperature as equal to the current value of the first interim setpoint temperature plus a predetermined temperature offset value.

9. A method of rapidly increasing the respective temperatures of first and second regions of a susceptor from a first and second initial temperature, respectively, to a first and second final temperature, comprising the steps of:

coupling first and second heating elements, respectively, to supply heat to the first and second regions of the susceptor; and establishing first and second interim setpoint temperatures so as to permit the first and second heating elements to heat the first and second regions of the susceptor to respective temperatures no greater than the first and second interim setpoint temperatures, respectively;

wherein the establishing step includes the steps of
progressively increasing the first interim setpoint temperature at successive times until the controller increases the first interim setpoint temperature to the first final temperature, and at each of said successive times, establishing the first interim setpoint temperature as equal to a current temperature of the first heating element plus the value of a predetermined heating rate.

10. The method of claim 9, further comprising the steps of:

establishing the second interim value as equal to the current value of the first interim setpoint plus a predetermined temperature offset value.

11. A method of rapidly increasing the respective temperatures of first and second regions of a susceptor, comprising the steps of:

coupling first and second heating elements, respectively, to supply heat to first and second regions of the susceptor;

during an initial time period, turning off the second heating element if the difference between the temperatures of the first and second heating elements exceeds a predetermined temperature offset value;

controlling the first heating element to heat up while the second heating element is turned off; and after said initial time period, the directing both the first and second heating elements to heat up.

12. The method of claim 11 wherein the controlling step further comprises the steps of:

allowing the first heating element to heat up for a predetermined period of time; and checking whether the difference between the temperatures of the heating elements exceeds the predetermined temperature offset value upon completion of the predetermined period of time.

13. The method of claim 12 further including the step of:

terminating the initial timer period when the difference between the temperatures of the heating elements no longer exceeds the predetermined temperature offset value.

14. The method of claim 12, further comprising the step of:

after said initial time period, directing the first and second heating elements to heat up at respective rates that do not exceed a predetermined heating rate;

wherein the controlling step further comprises the step of directing the first heating element to heat up at a maximum rate that exceeds a predetermined heating rate while the second heating element is turned off.

15. The apparatus of claim 1, wherein the controller establishes the second interim setpoint temperature as equal to the second final temperature when the current value of the first interim setpoint temperature plus said predetermined temperature offset value is not substantially less than the second final temperature.

16. The apparatus of claim 1, wherein the first and second regions of the susceptor are inner and outer regions, respectively.

17. The apparatus of claim 2, wherein the first and second regions of the susceptor are inner and outer regions, respectively.

18. The apparatus of claim 4, wherein the first and second regions of the susceptor are inner and outer regions, respectively.

19. The method of claim 8, wherein the step of establishing first and second interim setpoint temperatures further comprises the step of:

establishing the second interim setpoint temperature as equal to the second final temperature when the current value of the first interim setpoint temperature plus said predetermined temperature offset value is not substantially less than the second final temperature.

20. The method of claim 8, wherein the first and second regions of the susceptor are inner and outer regions, respectively.

21. The method of claim 9, wherein the first and second regions of the susceptor are inner and outer regions, respectively.

22. The method of claim 11, wherein the first and second regions of the susceptor are inner and outer regions, respectively.

23. Heating apparatus for rapidly increasing the temperature of a susceptor from an initial temperature to a final temperature, comprising:

a processing chamber;

a susceptor disposed in the chamber;

a heating element coupled to supply heat to the susceptor; and a controller for controlling the heat supplied to the susceptor by the heating elements by establishing an interim setpoint temperature so as to permit the heating element to heat the susceptor to a temperature no greater than the interim setpoint temperature;

wherein the controller increases the temperature of the susceptor by progressively increasing the interim setpoint temperature at successive times until the controller increases the interim setpoint temperature to the final temperature; and wherein, at each of said successive times, the controller establishes the interim setpoint temperature as equal to the current temperature of the heating element plus the value of a predetermined heating rate.

24. A method of rapidly increasing the temperature of a susceptor from an initial temperature to a final temperature, comprising the steps of:

coupling a heating element to supply heat to the susceptor; and establishing an interim setpoint temperature so as to permit the heating element to heat the susceptor to a temperature no greater than the interim setpoint temperature;

wherein the establishing step includes the steps of progressively increasing the interim setpoint temperature at successive times until the controller increases the interim setpoint temperature to the final temperature, and at each of said successive times, establishing the interim setpoint temperature as equal to a current temperature of the heating element plus the value of a predetermined heating rate.

* * * * *